United States Patent [19]
Bai

[11] Patent Number: 5,960,316
[45] Date of Patent: Sep. 28, 1999

[54] METHOD TO FABRICATE UNLANDED VIAS WITH A LOW DIELECTRIC CONSTANT MATERIAL AS AN INTRALINE DIELECTRIC

[75] Inventor: Gang Bai, San Jose, Calif.

[73] Assignee: Intel Corporation, Santa Clara, Calif.

[21] Appl. No.: 08/829,054

[22] Filed: Mar. 31, 1997

[51] Int. Cl.⁶ .................................................. H01L 21/02
[52] U.S. Cl. .................... 438/633; 438/634; 438/637; 438/669; 438/780
[58] Field of Search ..................... 438/618, 631, 438/624, 626, 633, 634, 637, 669, 645, 692, 763, 780

[56] References Cited

U.S. PATENT DOCUMENTS

| | | | |
|---|---|---|---|
| 4,605,470 | 8/1986 | Gwozdz et al. | 156/643 |
| 5,312,512 | 5/1994 | Allman et al. | 156/636 |
| 5,599,740 | 2/1997 | Jang et al. | 438/626 |
| 5,721,157 | 2/1998 | Sunada | 438/624 |
| 5,750,415 | 5/1998 | Gnade et al. | 438/618 |
| 5,804,503 | 9/1998 | Leidy et al. | 438/633 |
| 5,851,916 | 12/1998 | Howard | 438/626 |
| 5,864,880 | 12/1998 | Lee | 438/669 |

*Primary Examiner*—Olik Chaudhuri
*Assistant Examiner*—Kurt Eaton
*Attorney, Agent, or Firm*—Blakely, Sokoloff, Taylor & Zafman

[57] ABSTRACT

A method of fabricating an unlanded via over a polymer that is used as an intraline or intralayer dielectric is described. In one embodiment, the present invention creates an etch-stop layer for forming unlanded vias using three steps. A recess is created in an intraline dielectric, such as an organic polymer. An etch-stop layer is then deposited over the intraline dielectric. The etch-stop layer is then polished back before depositing a final insulating layer. The unlanded via is formed by etching through the final insulating layer. The intraline dielectric is protected by the etch-stop layer during the etch of the final insulating layer to form the unlanded via.

21 Claims, 5 Drawing Sheets

METHOD TO FABRICATE UNLANDED VIAS WITH A LOW DIELECTRIC CONSTANT MATERIAL AS AN INTRALINE DIELECTRIC

BACKGROUND OF THE INVENTION

1. Field of the Invention

The present invention relates generally to semiconductor processing. More specifically, the present invention relates to a structure and method for forming an unlanded via.

2. Description of Related Art

During manufacturing of a semiconductor integrated circuit, electrically conductive materials patterned in electrical circuitry are layered over a base transistor structure that is disposed on a semiconductor substrate. The electrically conductive materials, such as copper, are in different and noncontiguous planes. Vias or pathways connect the various layers of electrically conductive materials. An insulator or a dielectric material is placed between the separate planes of conductive material around the vias and also within the trenches and the circuit pattern of a layer of conductive material. Vias are usually formed as landed vias, which rest entirely on a conductive layer, and not as unlanded vias, which rest partially on a conductive layer and partially on an insulator.

The demand for closer packing of devices means increased packing density of vias. Unlanded vias are preferable to landed vias in order to achieve a higher packing density. In addition, because better device performance can be achieved with lower capacitance between conductive lines within an insulating layer, the industry is moving toward using insulators with a lower dielectric constant (K), such as an organic polymer (K~2.5) instead of silicon dioxide (K~4.0). Thus, the next generation of chip sets requires unlanded vias and low dielectric constant materials as intraline dielectrics.

FIG. 1 is a cross-section illustrating an interconnect structure in which two landed vias 111 and 113 are formed according to a prior art method. Metal lines 100 with oxide caps 103 are patterned and formed. A polymer 105 is then deposited and filled around the metal lines 100. Polymer 105 is polished back using chemical-mechanical polish until a top surface of polymer 105 is flush with a top surface of oxide cap 103. A thin passivation layer 107 is then deposited. Next, an interlayer dielectric 109, such as silicon dioxide, is deposited. Standard lithography is used to form landed vias 111 and 113. Landed vias 111 and 113 are created by etching through interlayer dielectric 109, through passivation layer 107, and through oxide cap 103 until landed vias 111 and 113 contact metal lines 100.

The same process is then used to create unlanded vias 200 and 202 in FIG. 2. Unfortunately, the prior art method shown in FIG. 1 cannot be used to create unlanded vias 200 and 202. During the etch of unlanded vias 200 and 202, polymer 105 has been punched through, which leads to device reliability problems. In addition, unlanded vias 200 and 202 cannot be filled with a metal, such as tungsten, because tungsten cannot nucleate on a polymer 105. Thus, a void is created and device performance is degraded. Thus, the prior art method cannot be used to create unlanded vias 200 and 202 as shown in FIG. 2 in the presence of a polymer. Therefore, the prior art method fails to allow the fabrication of unlanded vias over a metal and a polymer that is used as an intraline dielectric.

SUMMARY

The present invention relates to a method for forming an interconnect structure. The method comprises the following steps. A conductive structure having an insulator cap is formed. A low dielectric constant material is formed over the conductive structure. The low dielectric constant material is planarized. The low dielectric constant material is then selectively removed to create a recess. A stop layer is formed over the recess of the low dielectric constant material and over the conductive structure. The stop layer is then planarized.

BRIEF DESCRIPTION OF THE DRAWINGS

The present invention is illustrated by way of example and not by limitation in the figures of the accompanying drawings in which like references indicate similar elements.

DETAILED DESCRIPTION

Figure 1:
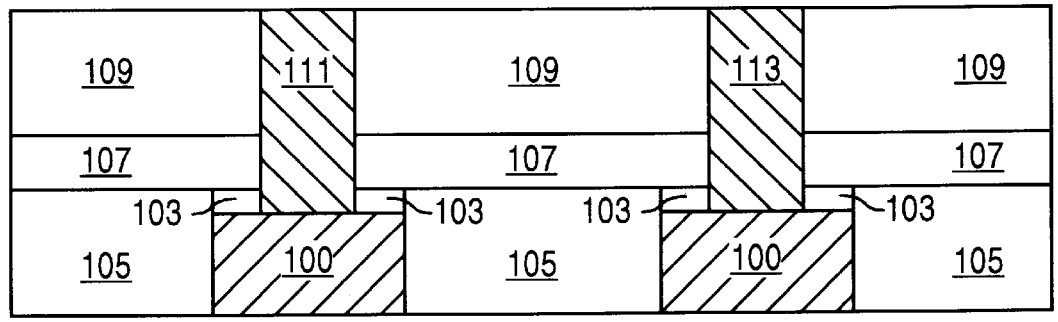
FIG. 1 illustrates a cross-sectional view of a prior art method for forming landed vias.
Figure 2:
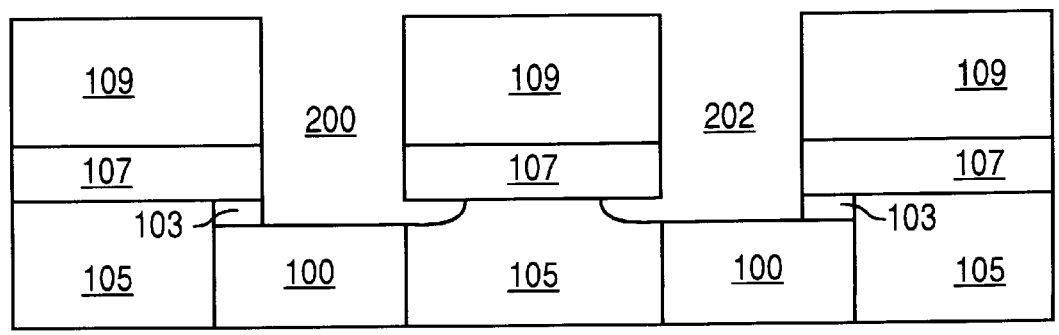
FIG. 2 is a cross-section illustrating why the prior art method cannot be used to form unlanded vias.

A method of forming an interconnect structure comprising an unlanded via formed over a low dielectric constant material as an intralayer dielectric is described. In the following description, numerous specific details are given to provide a thorough understanding of the invention. But it will be apparent to one skilled in the art that the invention may be practiced without these specific details. Moreover, in some instances, well-known semiconductor equipment and processes have not been set forth in detail in order not to unnecessarily hide the present invention.

The present invention is a method of forming an interconnect structure with unlanded vias and low dielectric constant materials used as an intraline dielectric. In one embodiment, the present inventive method comprises the following steps. A conductive structure having an insulator cap is formed. A low dielectric constant material is then formed over the conductive structure. The low dielectric constant material, such as an organic polymer, is then planarized. The low dielectric constant material is selectively removed to create a recess or a step between the low dielectric constant material and the conductive structure. An etch-stop layer is formed over the recess of the low dielectric constant material and over the conductive structure. The etch-stop layer is then planarized. An insulator is then formed over the etch-stop layer and part of the insulator is then removed to form an unlanded via. The unlanded via contacts the conductive structure and the etch-stop layer.

In one embodiment, the step of planarizing the etch-stop layer includes polishing the etch-stop layer until a top surface of the etch-stop layer is substantially planar with the top surface of the insulator cap of the conductive structure. In this embodiment, the unlanded via also contacts the insulator cap because part of the insulator cap is etched so that the unlanded via contacts the conductive structure. But in another embodiment, the step of planarizing the etch-stop layer includes polishing the etch-stop layer until a top surface of the etch-stop layer is substantially planar with the top surface of the conductive structure, wherein the insulator cap is removed during this planarization step. Consequently, the unlanded via contacts the conductive structure after etching through only the insulator.

The present invention provides several advantages over the prior art. The present invention allows the formation of unlanded vias over a low dielectric constant material, such as an organic polymer, that is used as an intraline or intralayer dielectric. Because an etch-stop layer protects the polymer during the via etch, there is no "punching through" the polymer. Thus, the low dielectric constant material (e.g., a polymer) is not exposed during the filling of the unlanded via. Therefore, a metal, such as tungsten, can be used to form a tungsten plug in the unlanded via. The tungsten is able to nucleate because it is not exposed to the low dielectric constant material, which can be a polymer. Consequently, a void is not created and device performance is not degraded. Thus, the present invention allows greater packing density with the formation of unlanded vias and thus meets the industry demand for greater chip density.

Figure 3A:
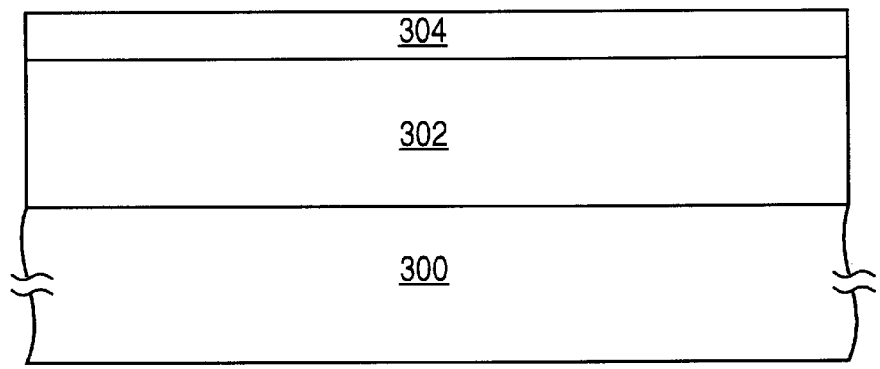
FIG. 3A illustrates the first step in one embodiment of the present invention.

FIGS. 3A–3I are a cross-sectional view illustrating one embodiment of the present inventive method. Referring to FIG. 3A, a first conductive layer 302 is formed over a substrate 300. The substrate 300 typically contains active and passive semiconductor devices, at and within the substrate 300. The substrate can also be one of the layers in a multi-level interconnect. A first insulator 304 is formed over first conductive layer 302. In one embodiment, it is preferable that first insulator 304 be as thin a layer as possible, but still be able to serve as a polishing stop layer. In one embodiment, first insulator 304 has a thickness in the range of about 100 Angstroms (Å) to about 500 Å. It is to be appreciated that the thickness of first insulator 304 depends on the type of dielectric used as first insulator 304 and on the subsequent polishing process. First conductive layer 302 can be formed during a metallization step using CVD (chemical vapor deposition) metallization, sputter deposition, a metal reflow process or any other applicable method. First conductive layer 302 comprises a material selected from the group consisting of aluminum, copper, tungsten, silver, gold and their respective alloys. It is to be appreciated that other conductive materials can also be used to form first conductive layer 302. In addition, it will be appreciated that the circuit design determines the thickness of the first conductive layer 302. First insulator 304 can be formed using standard chemical vapor deposition (CVD) methods or other applicable techniques. In one embodiment, first insulator 304 is an oxide and first conductive layer 302 is aluminum.

Figure 3B:
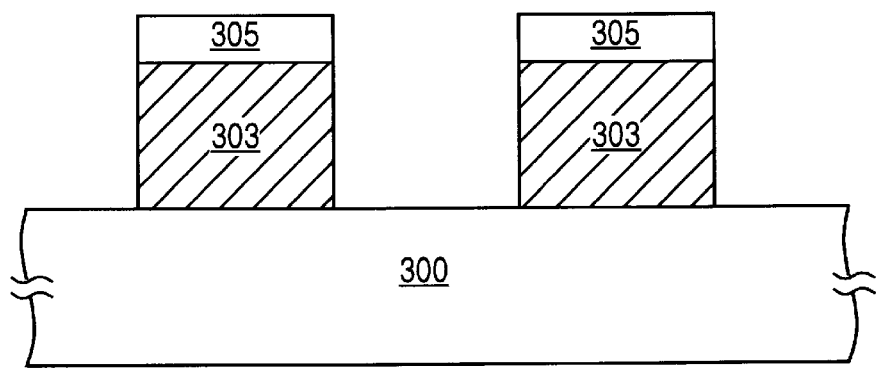
FIG. 3B illustrates a cross-section of the step following FIG. 3A.
Figure 3C:
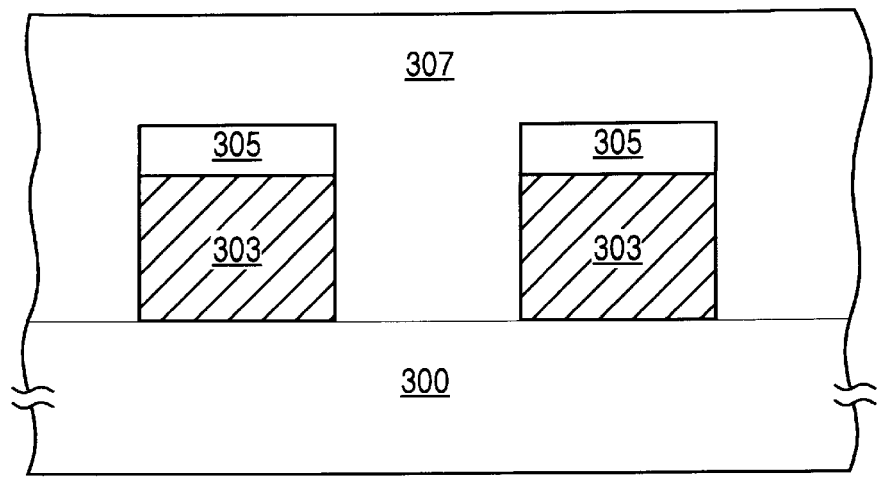
FIG. 3C illustrates a cross-section of the step following FIG. 3B.

In FIG. 3B, conventional lithography techniques are used to pattern and form a conductive structure or line 303 having an insulator cap 305. Next, as shown in FIG. 3C, a low dielectric constant material 307 (e.g., a dielectric constant (K) of less than 4) is formed over the conductive structure or line 303 and insulator cap 305. In one embodiment, low dielectric constant material 307 is an organic polymer, such as PAE (polyarylether). If low dielectric constant material 307 is a polymer, such as but not limited to parylene, polynaphthalene, Teflon (polytetrafluorethylene), then it 307 is deposited using CVD techniques. On the other hand, a spin-on deposition is preferred if low dielectric constant material 307 is a polymer, such as but not limited to PAE, Flare™ (fluorinated poly(arylene ether)), polyimide and polyquinoline. Because dielectric films contribute to the capacitance of a interconnection system, the use of a lower dielectric constant material (e.g., PAE) improves interconnect performance in three areas: decreasing RC (resistance-capacitance) delay, decreasing cross-talk and decreasing power dissipation. Thus, device reliability increases.

Figure 3D:
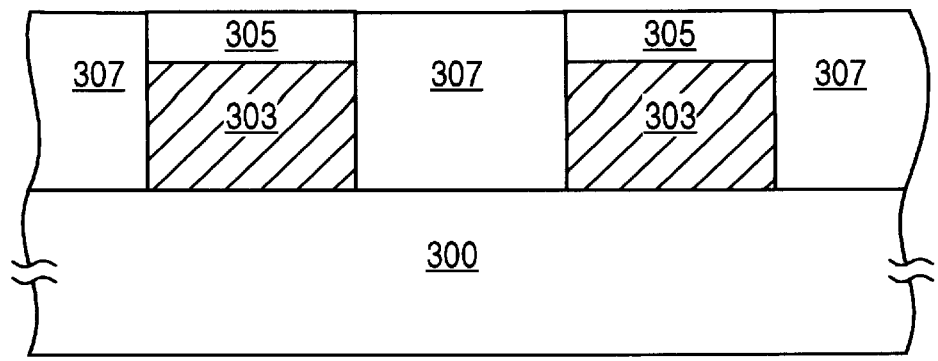
FIG. 3D is a cross-section illustrating the next step after FIG. 3C.

In FIG. 3D, low dielectric constant material 307 is planarized until first insulator cap 305 is exposed. In one embodiment, low dielectric constant material 307 is planarized using chemical-mechanical polish techniques, which are well-known in the art. It is to be appreciated that other planarization techniques can also be used.

Figure 3E:
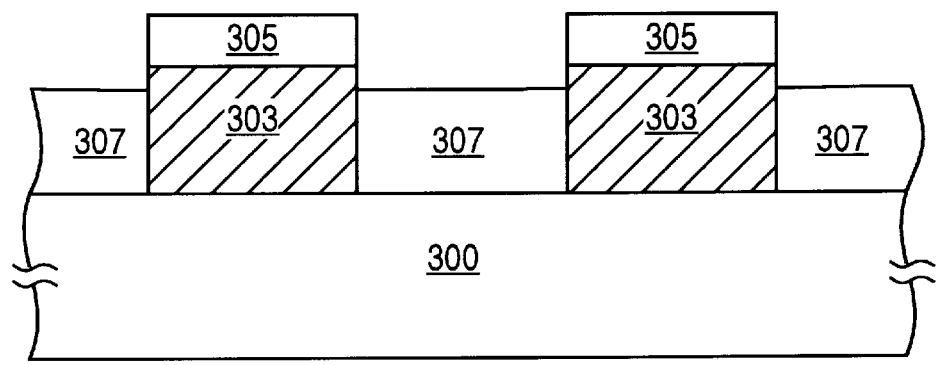
FIG. 3E is a cross-section illustrating the formation of a recess in a low dielectric constant material, which follows after FIG. 3D.

Referring to FIG. 3E, low dielectric constant material 307 is selectively removed to create a recess so that a top surface of low dielectric constant material 307 is below a top surface of conductive structure 303. In one embodiment, an oxygen plasma etch is used to etch low dielectric constant material 307 without etching first insulator cap 305. In another embodiment, a wet etch can be used to selectively etch low dielectric constant material 307 without etching first insulator cap 305. It will be appreciated that other methods can also be used to selectively remove low dielectric constant material 307. The depth of the recess created can vary depending on the thickness of the first insulator cap 305 and a subsequently formed stop layer 309 (shown in FIG. 3F). In one embodiment, the depth of the recess created by selective etch or removal of low dielectric constant material 307 can be in the range of about 50 Å to about 100 Å.

Figure 3F:
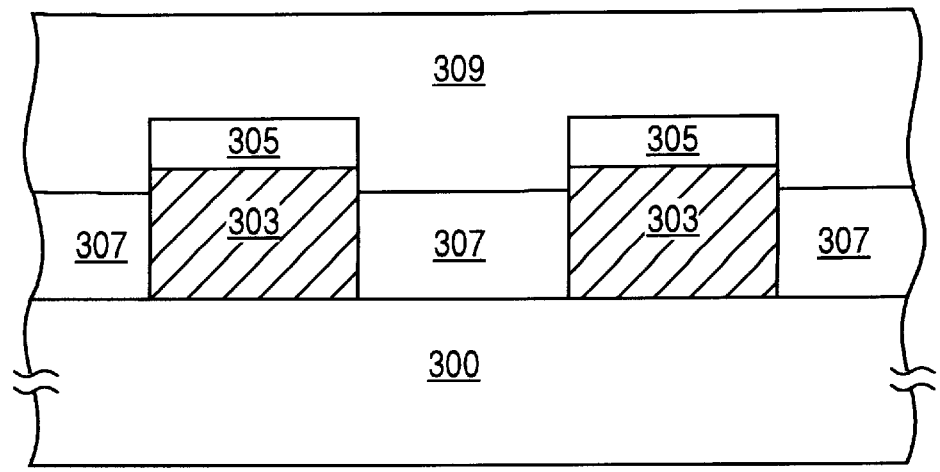
FIG. 3F is a cross-section illustrating the step following FIG. 3E.
Figure 3G:
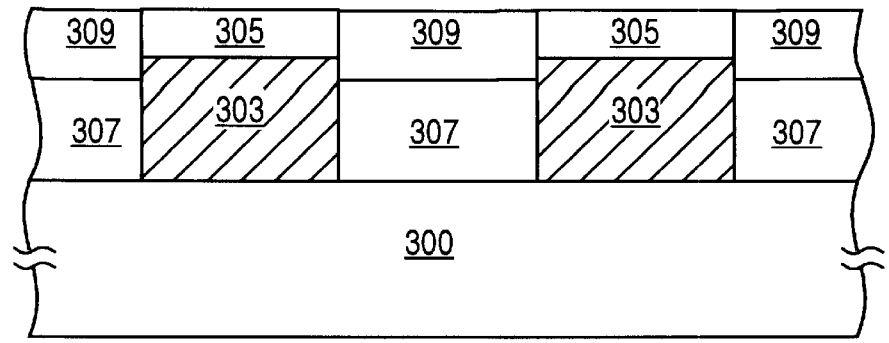
FIG. 3G illustrates a cross-section of the planarization of an etch-stop layer, which follows the step shown in FIG. 3F.

In FIG. 3F, a second insulator 309 is formed over low dielectric constant material 307 and conductive structure 303 and its first insulator cap 305. Second insulator 309 can be any dielectric that can serve as an etch-stop layer. In one embodiment, second insulator 309 is preferably silicon nitride. Referring to FIG. 3G, second insulator 309 is planarized. In one embodiment, conventional chemical-mechanical polish techniques are used to polish back second insulator 309. Second insulator 309 is planarized until a top surface of first insulator cap 305 is exposed. In one embodiment, second insulator 309 is planarized until a top surface of second insulator 309 is substantially planar with the top surface of first insulator cap 305.

Figure 3H:
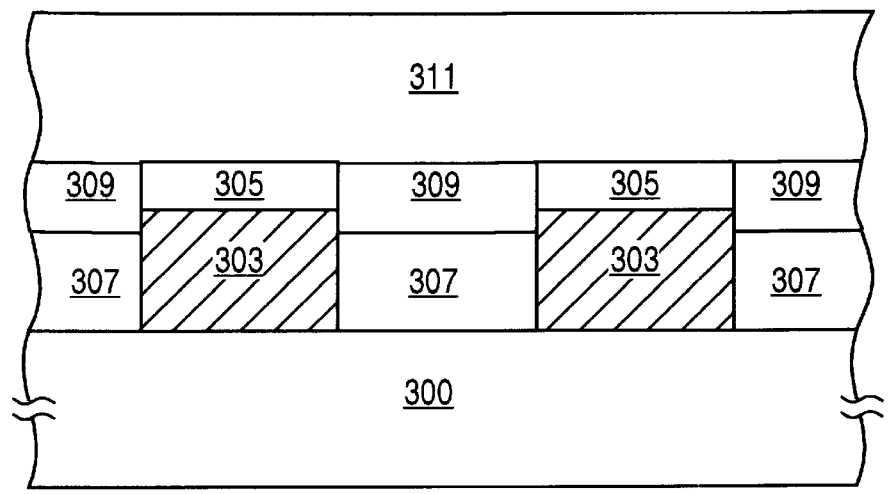
FIG. 3H illustrates a cross-section of the step following FIG. 3G.

In FIG. 3H, a third insulator or interlayer dielectric 311 is formed over the substrate shown in FIG. 3G. In one embodiment, third insulator 311 is preferably a material with a lower dielectric constant than the second insulator 309. Thus, in one embodiment, third insulator 311 is an oxide, such as silicon dioxide, and second insulator 309 is a nitride, such as silicon nitride.

Figure 3I:
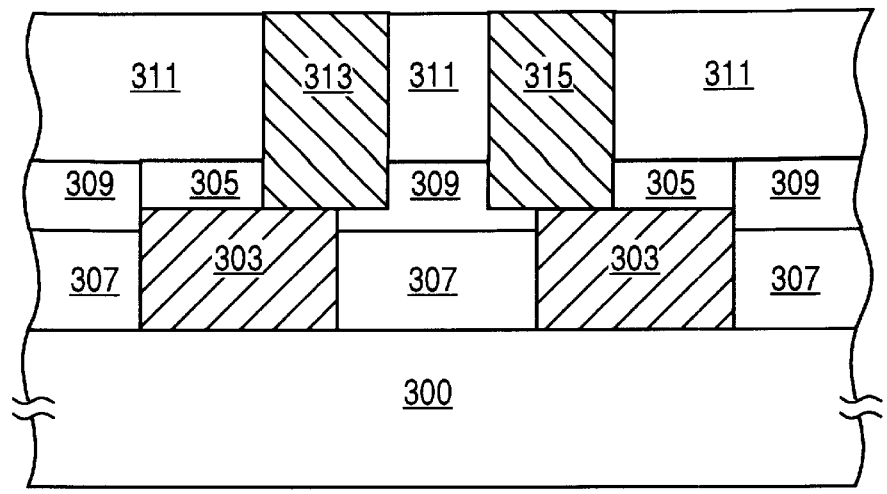
FIG. 3I is a cross-section illustrating the formation of two unlanded vias, which follows the step shown in FIG. 3H.

Referring to FIG. 3I, two unlanded vias 313 and 315 are etched through third insulator 311. A portion of first insulator cap 305 and second insulator 309 are also etched during the formation of unlanded vias 313 and 315. In one embodiment, unlanded vias 313 and 315 can be filled with a metal, such as tungsten to form a tungsten plug that is electrically connected to conductive structure or line 303. Unlike the prior art, low dielectric constant material 307 is protected during the etch or formation of unlanded vias 313 and 315 and also during a metal fill of unlanded vias 313 and 315. It is to be appreciated that other conductive materials, such as copper, can also be used to fill unlanded vias 313 and 315. It is also to be appreciated that the higher the selectivity between third insulator 311 and second insulator 309, then the thinner second insulator 309 layer can be. It will also be apparent that the thickness of second insulator 309 that serves as an etch-stop layer is determined in part by the recess created in FIG. 3E during the selective removal of low dielectric constant material 307. Thus, the thickness of second insulator 309 is affected by a number of factors.

Figure 4A:
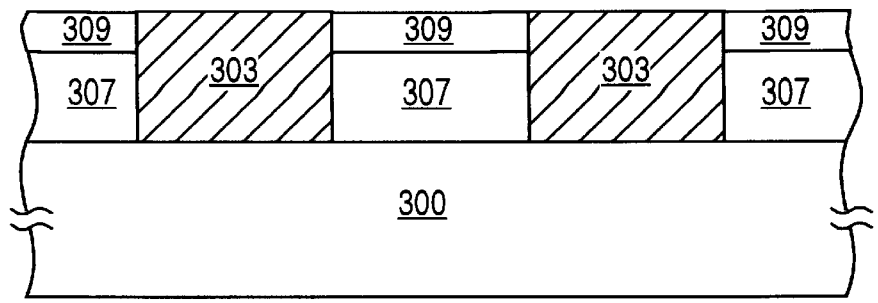
FIG. 4A is a cross-sectional view of another embodiment of the present invention.
Figure 4B:
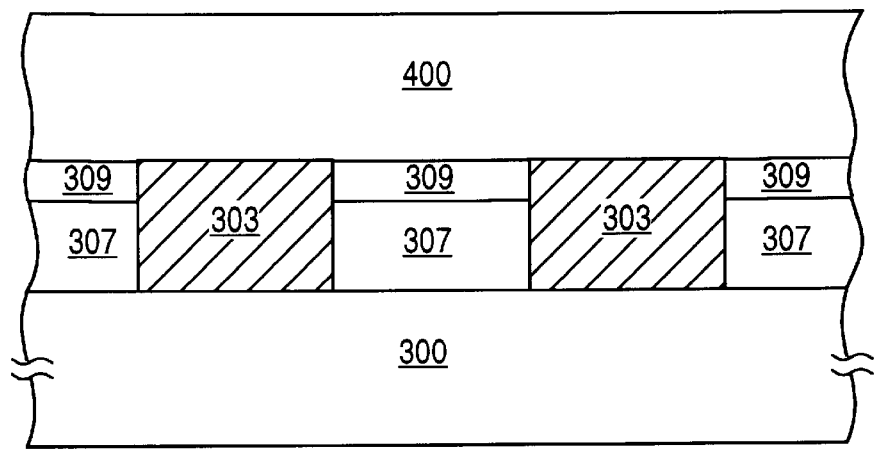
FIG. 4B illustrates a cross-section of the next step following FIG. 4A.
Figure 4C:
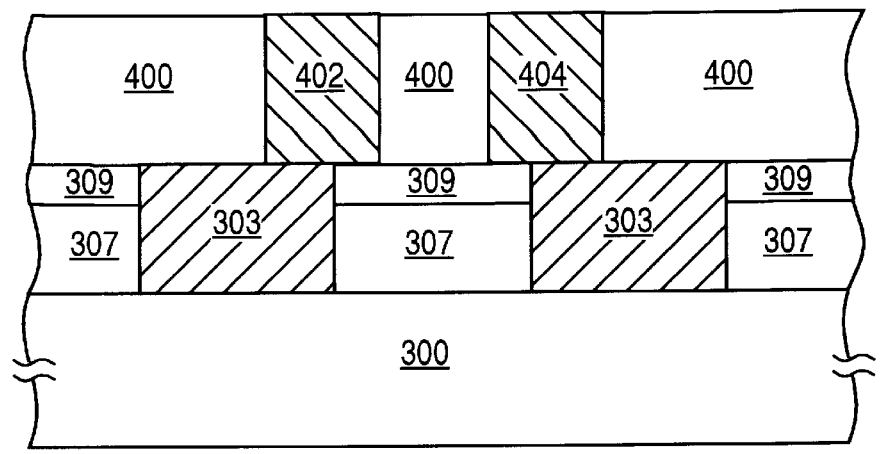
FIG. 4C is a cross-sectional view illustrating the final step of the embodiment shown in FIG. 4B.

A cross-sectional view illustrating another embodiment of the present invention is shown in FIGS. 4A–4C. Referring to FIG. 4A, the steps prior to the structure shown in FIG. 4A are the same as the steps illustrated in FIGS. 3A–3F. FIG. 4A differs from FIG. 3G in the amount of second insulator 309 that is planarized. In FIG. 4A, second insulator 309 is planarized until a top surface of conductive structure or line 303 is exposed. Thus, during the planarization of second insulator 309, first insulator cap 305 is removed. In one embodiment, a top surface of second insulator 309 is substantially planar with the top surface of conductive structure 303. Second insulator 309 can serve as an etch-stop layer during the etch to create the unlanded via.

In FIG. 4B, a third insulator 400 can be formed over second insulator 309 and conductive line 303. Third insulator 400 preferably has a lower dielectric constant than second insulator 309. In one embodiment, third insulator 400 is an oxide, such as silicon dioxide, and second insulator 309 is a nitride, such as silicon nitride. In FIG. 4C, two unlanded vias 402 and 404 are etched through third insulator 400. Unlanded vias 402 and 404 contact conductive structure 303 and second insulator 309. Second insulator 309 serves as an etch-stop layer during the etch of unlanded vias 402 and 404 through third insulator 400. Moreover, second insulator 309 also serves to protect low dielectric constant material 307 during the etch of unlanded vias 402 and 404. In addition, unlanded vias 402 and 404 can be filled with a metal, such as tungsten, to create a tungsten plug without creating a void since the tungsten is not exposed to the low dielectric constant material 307.

In the above description, numerous specific details are given to be illustrative and not limiting of the present invention. It will be evident to one skilled in the art that the invention may be practiced without these specific details. Moreover, in some instances, well-known semiconductor equipment and processes have not been set forth in detail in order to not unnecessarily obscure the present invention. Thus, the method of the present invention is defined by the appended claims.

I claim:

1. A method of forming an interconnect structure, comprising:
   forming a conductive structure having an insulator cap;
   forming a low dielectric constant material over said conductive structure;
   planarizing said low dielectric constant material;
   selectively removing said low dielectric constant material to create a recess;
   forming a stop layer over said recess of said low dielectric constant material and over said conductive structure; and
   planarizing said stop layer.

2. The method of claim 1, wherein the step of planarizing said stop layer includes polishing said stop layer until a top surface of said stop layer is substantially planar with a top surface of said insulator cap.

3. The method of claim 2, further including:
   forming an insulator over said stop layer and said insulator cap; and
   removing part of said insulator, part of said stop layer and part of said insulator cap to form an unlanded via that is capable of electrically contacting said conductive structure.

4. The method of claim 3, wherein said insulator has a different dielectric constant than said stop layer.

5. The method of claim 4, wherein said insulator is an oxide and said stop layer is a nitride.

6. The method of claim 1, wherein the step of planarizing said stop layer includes polishing said stop layer until a top surface of said stop layer is substantially planar with a top surface of said conductive structure, wherein said insulator cap is removed during said planarizing step.

7. The method of claim 6, further including:
   forming an insulator over said stop layer and said conductive structure; and
   removing part of said insulator to form an unlanded via that is capable of electrically contacting said conductive structure.

8. The method of claim 7, wherein said insulator has a different dielectric constant than said stop layer.

9. The method of claim 8, wherein said insulator is an oxide and said stop layer is a nitride.

10. The method of claim 1, wherein said low dielectric constant material is a polymer, and said stop layer has a different dielectric constant than said low dielectric constant material.

11. A method of forming an interconnect structure, comprising the steps of:
    forming a first conductive layer over a substrate;
    forming a first insulator over said conductive layer;
    patterning said first insulator and said first conductive layer to form a first insulator cap over a first conductive line;
    forming a low dielectric constant material over said first insulator cap and surrounding said first conductive line, wherein said low dielectric constant material has a dielectric constant of less than four (4);
    planarizing said low dielectric constant material until a top surface of said first insulator cap is exposed;
    selectively removing said low dielectric constant material to create a recess so that a top surface of said low dielectric constant material is below a top surface of said first conductive line;
    forming a second insulator over said low dielectric constant material, said first insulator cap and said first conductive line;
    planarizing said second insulator;
    forming a third insulator over said second insulator, wherein said third insulator has a different dielectric constant than said second insulator; and
    etching said third insulator to form an unlanded via, wherein said unlanded via contacts said first conductive line and said second insulator.

12. The method of claim 11, wherein the step of planarizing said second insulator includes planarizing said second insulator until said first insulator cap is exposed so that a top surface of said second insulator is substantially planar with a top surface of said first insulator cap, and wherein said unlanded via also contacts said first insulator cap.

13. The method of claim 11, wherein step of planarizing said second insulator includes planarizing said second insulator until a top surface of said second insulator is substantially planar with a top surface of said first conductive line, and wherein said first insulator cap is removed during step of planarizing said second insulator.

14. The method of claim 11, wherein said low dielectric constant material is an organic polymer.

15. The method of claim 11, wherein said first insulator has a thickness in the range of approximately 100 Angstroms (Å) to about 500 Å.

16. The method of claim 11, wherein said third insulator is an oxide and said second insulator is a nitride.

17. The method of claim 11, wherein said recess has a depth of approximately 50 Å to about 100 Å.

18. The method of claim 11, wherein said second insulator is any dielectric that can serve as an etch-stop layer.

19. The method of claim 11, wherein said first conductive line comprises a material selected from the group consisting of aluminum, copper, tungsten, silver, gold, copper and their respective alloys.

20. A method of forming an integrated circuit device, comprising:
   forming a conductive line having an insulating cap formed of a first insulator;
   forming a polymer over said conductive line;
   planarizing said polymer;
   etching said polymer to create a recess;
   forming an etch-stop layer of a second insulator over said recess of said polymer; and
   planarizing said etch-stop layer.

21. The method of claim 20, further comprising:
   forming a third insulator over said etch-stop-layer; and
   forming an unlanded via in said third insulator for providing an electrical connection between said conductive line and a conductive layer formed in said unlanded via.

* * * * *